(12) United States Patent
Fan et al.

(10) Patent No.: US 12,142,647 B2
(45) Date of Patent: Nov. 12, 2024

(54) SELF-ALIGNING BACKSIDE CONTACT PROCESS AND DEVICES THEREOF

(71) Applicant: Taiwan Semiconductor Manufacturing Company, Ltd., Hsinchu (TW)

(72) Inventors: Wei-Han Fan, Hsinchu (TW); Wei-Yang Lee, Taipei (TW); Tzu-Hua Chiu, Hsinchu (TW); Chia-Pin Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 375 days.

(21) Appl. No.: 17/461,412

(22) Filed: Aug. 30, 2021

(65) Prior Publication Data
US 2023/0065318 A1   Mar. 2, 2023

(51) Int. Cl.
| | |
|---|---|
| H01L 29/40 | (2006.01) |
| H01L 21/768 | (2006.01) |
| H01L 29/417 | (2006.01) |
| H01L 29/66 | (2006.01) |
| H01L 29/78 | (2006.01) |
| H01L 29/786 | (2006.01) |

(52) U.S. Cl.
CPC ...... *H01L 29/401* (2013.01); *H01L 21/76897* (2013.01); *H01L 29/41733* (2013.01); *H01L 29/41791* (2013.01); *H01L 29/66742* (2013.01); *H01L 29/66795* (2013.01); *H01L 29/785* (2013.01); *H01L 29/78696* (2013.01)

(58) Field of Classification Search
CPC ................................. H01L 21/76897
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2020/0294998 A1* | 9/2020 | Lilak ................. H01L 23/53295 |
| 2022/0139911 A1* | 5/2022 | Wei ................... H01L 29/78696 257/365 |

* cited by examiner

*Primary Examiner* — Moazzam Hossain
*Assistant Examiner* — Hajar Kolahdouzan
(74) *Attorney, Agent, or Firm* — Haynes and Boone, LLP (57) ABSTRACT

A method of forming a semiconductor including forming a source/drain feature adjacent to a semiconductor layer stack disposed over a substrate. The method further includes forming a dummy fin adjacent to the source/drain feature and adjacent to the semiconductor layer stack. The method further includes performing an etching process from a backside of the substrate to remove a first portion of the dummy fin adjacent to the source/drain feature, thereby forming a first trench in the dummy fin, where the first trench extends from the dummy fin to the source/drain feature. The method further includes forming a first dielectric layer in the first trench and replacing a second portion of the dummy fin with a source/drain contact.

20 Claims, 11 Drawing Sheets

SELF-ALIGNING BACKSIDE CONTACT PROCESS AND DEVICES THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

To continue to provide the desired scaling and increased density for multi-gate devices (e.g., FinFETs and GAA devices) in advanced technology nodes, continued reduction in contact landings and power rail connections are necessary. In at least some existing implementations, various schemes have been used to reduce the size of the contact landings. However, such schemes cannot provide the level of device density, cell isolation, and device performance required for aggressively scaled circuits and devices. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Continuing to provide the desired scaling and increased density for multi-gate devices (e.g., FinFETs and GAA devices) in advanced technology nodes calls for improved techniques for forming source/drain contacts and connections to the power rail. In at least some existing implementations, a source/drain contact is formed on a top surface of a source/drain feature, a via is formed on the source/drain contact, and the via is connected to a power rail disposed along a frontside of a substrate. As the scale of the devices decreases, resistance caused by smaller feature areas increases. While some existing implementations may provide for scaling features on current devices, it is becoming increasingly difficult to provide the level of device density, cell isolation, and device performance required for aggressively scaled circuits and devices. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including a self-aligned source/drain contact formation scheme, that provides contact to a power rail disposed along a backside of a substrate, to achieve lower resistance at the contact areas. In some embodiments, employing a self-aligned backside contact allows for a larger contact area and improves device density and performance. For example, a self-aligned backside contact improves the overall critical dimensions by improving overlay and critical dimension control. Moreover, according to some embodiments, the self-aligned backside contact allows for a larger contact area, thereby decreasing the resistance of the contact. By employing the disclosed self-aligned backside contact scheme, device density may be increased, cell isolation is improved, and device performance is enhanced. Other embodiments and advantages will be evident to those skilled in the art upon reading the present disclosure.

Figure 1:
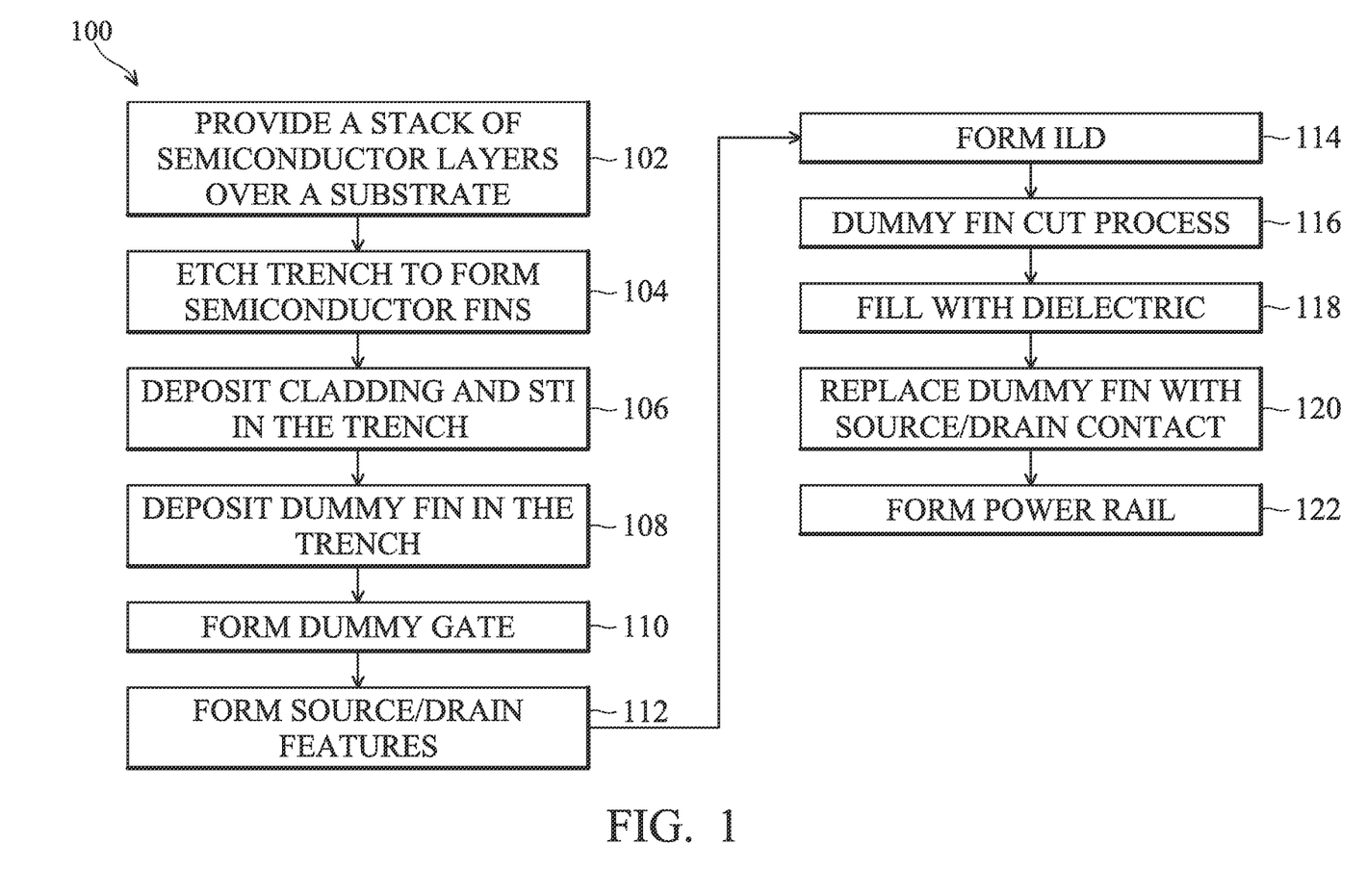
FIG. 1 is a flow chart of a method of fabricating a multi-gate device according to one or more aspects of the present disclosure.

Illustrated in FIG. 1 is a method 100 of semiconductor fabrication including fabrication of multi-gate devices having a self-aligned backside contacts with a larger contact area, in accordance with various embodiments. As discussed above, multi-gate devices may include FinFETs, GAA devices, or other devices having gate structures formed on at least two-sides of a channel region and may include devices having channel regions formed as nanosheet channel(s), nanowire channel(s), bar-shaped channel(s), and/or other suitable channel configurations. The method 100 is discussed below with reference to a GAA device having a channel region that may be referred to as a nanowire and/or nanosheet and which may include various geometries (e.g., cylindrical, bar-shaped) and dimensions. However, it will be understood that aspects of the method 100, including the self-aligned backside contact, may be equally applied to other types of multi-gate devices (e.g., such as FinFETs or devices including both GAA devices and FinFETs) without departing from the scope of the present disclosure. It is understood that the method 100 includes steps having features of a complementary metal-oxide-semiconductor (CMOS) technology process flow and thus, are only described briefly herein. Also, additional steps may be performed before, after, and/or during the method 100.

FIGS. 2A, 3A, 4A, 5A, 6A, 7A, 8A, 9A, 10A, and 11A are top down views of an embodiment of a semiconductor device 200 according to various stages of the method 100 of FIG. 1. FIGS. 2B, 3B, 4B, 5B, 6B, 7B, 8B, 9B, 10B, and 11B are cross-section views, corresponding to respective top down views listed above, of an embodiment of the semiconductor device 200 along a plane A-A', the plane A-A' being perpendicular to a channel of the device 200 and traversing a source/drain region of the device 200. FIGS. 2C, 3C, 4C, 5C, 6C, 7C, 8C, 9C, 10C, and 11C are cross-section views, corresponding to respective top down views listed above, of an embodiment of the semiconductor device 200 along a plane B-B', the plane B-B' being parallel to the channel of the device 200.

Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where a substrate including a stack of semiconductor layers is provided. Referring to the example of FIGS. 2A, 2B, and 2C, in an embodiment of block 102, a substrate 202 including a stack of semiconductor layers 203 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Figures 2A, 2B:
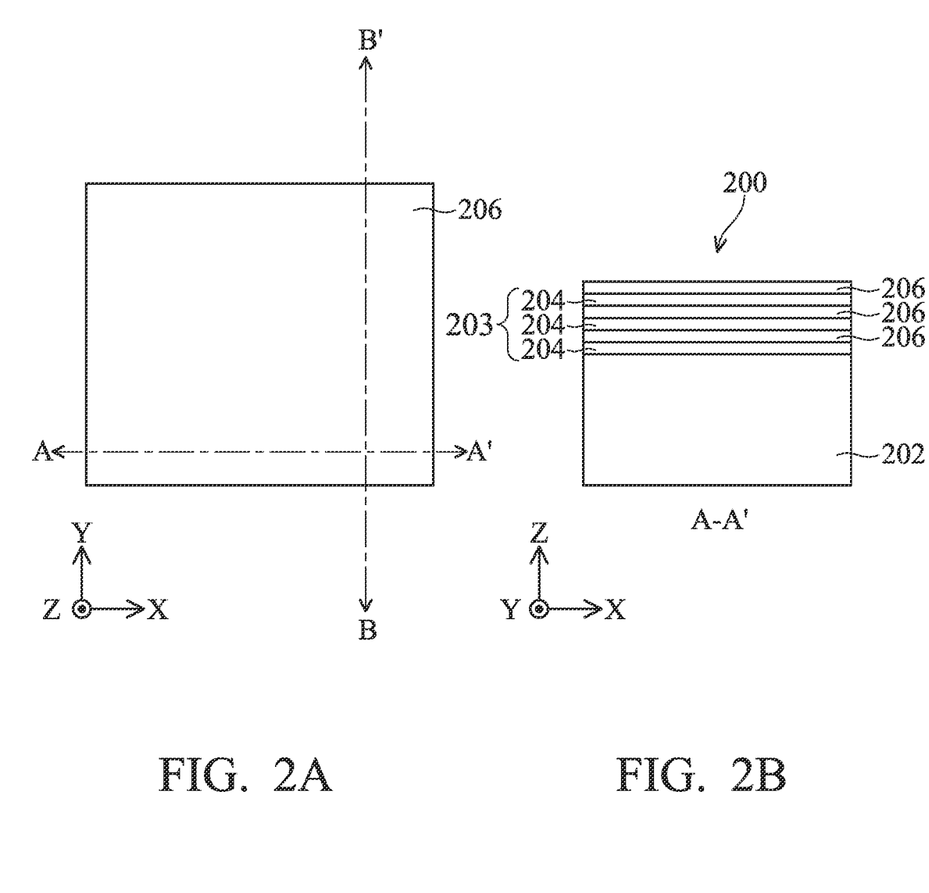
FIGS. 2A, 3A, 4A, 5A, 6A, 7A, 8A, 9A, 10A, and 11A are top down views of an embodiment of a semiconductor device 200 according to various stages of the method of FIG. 1.
FIGS. 2B, 3B, 4B, 5B, 6B, 7B, 8B, 9B, 10B, and 11B are cross-section views, corresponding to respective top down views listed above, of an embodiment of the semiconductor device 200 along a plane A-A', the plane A-A' being perpendicular to a channel of the device 200, and traversing a source/drain region of the device 200, in accordance with some embodiments.
Figure 2C:
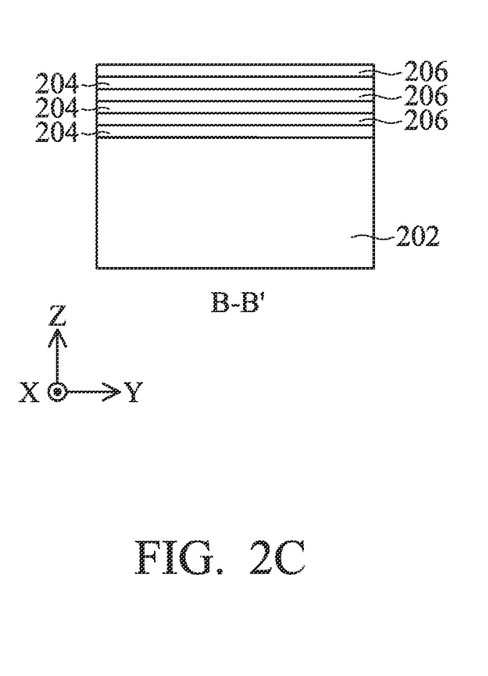
FIGS. 2C, 3C, 4C, 5C, 6C, 7C, 8C, 9C, 10C, and 11C are cross-section views, corresponding to respective top down views listed above, of an embodiment of the semiconductor device 200 along a plane B-B', the plane B-B' being parallel to the channel of the device 200 in accordance with some embodiments.

The stack of semiconductor layers 203 includes semiconductor layers 204 and semiconductor layers 206 stacked vertically (e.g., along the z-direction) in an interleaving or alternating configuration from a surface of substrate 202. In some embodiments, semiconductor layers 204 and semiconductor layers 206 are epitaxially grown in the depicted interleaving and alternating configuration. For example, a first one of semiconductor layers 204 is epitaxially grown on substrate 202, a first one of semiconductor layers 206 is epitaxially grown on the first one of semiconductor layers 204, a second one of semiconductor layers 204 is epitaxially grown on the first one of semiconductor layers 206, and so on until the stack of semiconductor layers 203 has a desired number of semiconductor layers 204 and semiconductor layers 206. In such embodiments, semiconductor layers 204 and semiconductor layers 206 can be referred to as epitaxial layers. In some embodiments, epitaxial growth of semiconductor layers 204 and semiconductor layers 206 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 204 is different than a composition of semiconductor layers 206 to achieve etching selectivity and/or different oxidation rates during subsequent processing. In some embodiments, semiconductor layers 204 have a first etch rate to an etchant and semiconductor layers 206 have a second etch rate to the etchant, where the second etch rate is less than the first etch rate. In some embodiments, semiconductor layers 204 have a first oxidation rate and semiconductor layers 206 have a second oxidation rate, where the second oxidation rate is less than the first oxidation rate. In the depicted embodiment, semiconductor layers 204 and semiconductor layers 206 include different materials, constituent atomic percentages, constituent weight percentages, thicknesses, and/or characteristics to achieve desired etching selectivity during an etching process, such as an etching process implemented to form suspended channel layers in channel regions of semiconductor device 200. For example, where semiconductor layers 204 include silicon germanium and semiconductor layers 206 include silicon, a silicon etch rate of semiconductor layers 206 is less than a silicon germanium etch rate of semiconductor layers 204. In some embodiments, semiconductor layers 204 and semiconductor layers 206 can include the same material but with different constituent atomic percentages to achieve the etching selectivity and/or different oxidation rates. For example, semiconductor layers 204 and semiconductor layers 206 can include silicon germanium, where semiconductor layers 204 have a first silicon atomic percent and/or a first germanium atomic percent and semiconductor layers 206 have a second, different silicon atomic percent and/or a second, different germanium atomic percent. The present disclosure contemplates that semiconductor layers 204 and semiconductor layers 206 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 206 or portions thereof form channel regions of semiconductor device 200. In the depicted embodiment, the stack of semiconductor layers 203 includes three semiconductor layers 204 and three semiconductor layers 206 configured to form three semiconductor layer pairs disposed over substrate 202, each semiconductor layer pair having a respective semiconductor layer 204 and a respective semiconductor layer 206. After undergoing subsequent processing, such configuration will result in multigate device 200 having three channels. However, the present disclosure contemplates embodiments where the stack of semiconductor layers 203 includes more or less semiconductor layers, for example, depending on a number of channels desired for semiconductor device 200 (e.g., a GAA transistor) and/or design requirements of semiconductor device 200. For example, the stack of semiconductor layers 203 can include two to ten semiconductor layers 204 and two to ten semiconductor layers 206. In the depicted embodiment, the topmost layer is formed of semiconductor layer 206 as shown in the top down view of FIG. 2A and cross-sectional views of FIGS. 2B and 2C. It is also noted that while the semiconductor layers 204, 206 are shown as having a particular stacking sequence within the fins 203, where the semiconductor layer 206 is the topmost layer of the stack of semiconductor layers 204, 206, other configurations are possible. For example, in some cases, the semiconductor layer 204 may alternatively be the topmost layer of the stack of layers 204, 206. As another example, the semiconductor layer 206 may be grown on the substrate 202 followed by the semiconductor layer 204 and followed by another semiconductor layer 206. Stated another way, the order of growth for the layers 204, 206, and thus their stacking sequence, may be switched or otherwise be different than what is shown in the figures, while remaining within the scope of the present disclosure.

The method 100 then proceeds to block 104 where fins are formed by etching trenches in the stack of semiconductor material.

Figures 3A, 3B:
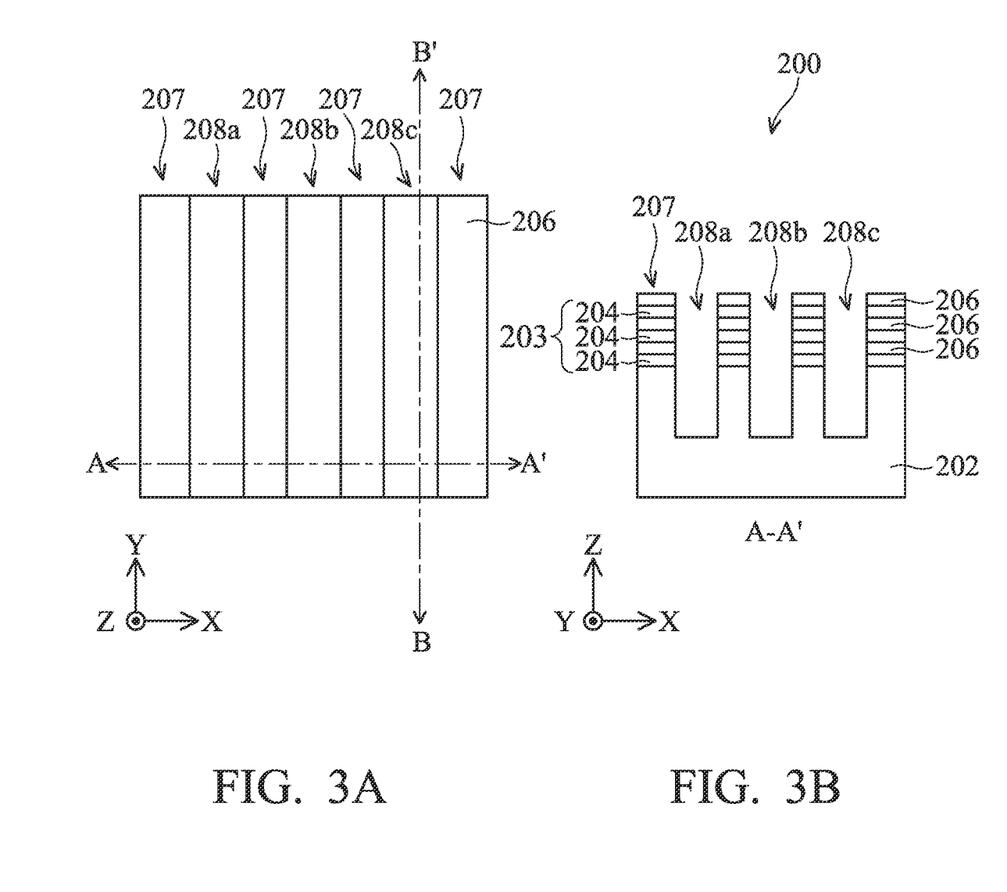
Figure 3C:
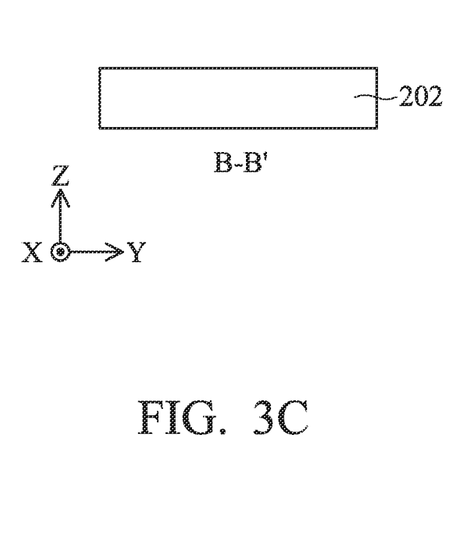

With reference to FIGS. 3A, 3B, and 3C, in an embodiment of block 104, the fins 207 are formed by etching the trenches 208a, 208b, and 208c in the stack of semiconductor layers 203 by an etching process. In the depicted embodiment, the trenches 208a, 208b, and 208c are formed by an etching process that completely removes a portion of the semiconductor layers 204 and the semiconductor layers 206 of the semiconductor device 200 and partially removes a portion of the substrate 202. After the etching process, the trenches 208a, 208b, and 208c have sidewalls defined by the substrate 202 and remaining portions of the semiconductor layers 204 and the semiconductor layers 206 and have bottoms defined by the substrate 202. In some embodiments, the etching process further removes some, but not all, of the substrate 202, such that the trenches 208a, 208b, and 208c extend below a topmost surface of the substrate 202. The etching process can include a dry etching process, a wet etching process, other suitable etching process, or combinations thereof. In some embodiments, the etching process is a multi-step etch process. For example, the etching process may alternate etchants to separately and alternately remove the semiconductor layers 204 and the semiconductor layers 206. In some embodiments, a lithography process, such as those described herein, is performed to form a patterned mask layer that covers portions of the stack of semiconductor layers 203 and the etching process uses the patterned mask layer as an etch mask.

In various embodiments, each of the fins 207 includes a substrate portion formed from the substrate 202, the semiconductor layers 204, and the semiconductor layers 206. In some embodiments, a hard mask layer may be removed (e.g., by a CMP process) prior to formation of the fins 207. In some examples, a hard mask layer is used to mitigate loss of material of the fins 207 during a subsequent gate etch process. In various embodiments, the semiconductor layers 206 (e.g., including the second composition), or portions thereof, may form a channel region of a GAA transistor of the semiconductor device 200. For example, the semiconductor layers 206 may be referred to as nanosheets or nanowires that are used to form a channel region of a GAA device. These nanosheets or nanowires are also used to form portions of the source/drain features of the GAA device, as discussed below. In embodiments where a FinFET is formed, each of the fins 207 may alternatively include an epitaxial layer of a uniform composition formed over the substrate portion, or each of the fins 207 may include a portion of the patterned substrate without an additional epitaxial layer formed over the substrate portion.

It is noted that while the fins 207 are illustrated as including three (3) layers of the semiconductor layer 206 and three (3) layers of the semiconductor layer 204, this is for illustrative purposes only and not intended to be limiting beyond what is specifically recited in the claims. It can be appreciated that any number of epitaxial layers can be formed, where for example, the number of epitaxial layers depends on the desired number of channels regions for the GAA device. In some embodiments, the number of semiconductor layers 204 is between 4 and 10.

In some embodiments, the semiconductor layer 206 has a thickness range of about 4-8 nanometers (nm). In some cases, the semiconductor layer 204 has a thickness range of about 5-8 nm. As noted above, the semiconductor layers 206 may serve as channel region(s) for a subsequently-formed multi-gate device (e.g., a GAA device) and its thickness may be chosen based on device performance considerations. The semiconductor layers 204 may serve to define a gap distance between adjacent channel region(s) for the subsequently-formed multi-gate device and its thickness may also be chosen based on device performance considerations.

The method 100 then proceeds to block 106 where shallow trench isolation (STI) regions and cladding are deposited in the trenches.

Figures 4A, 4B:
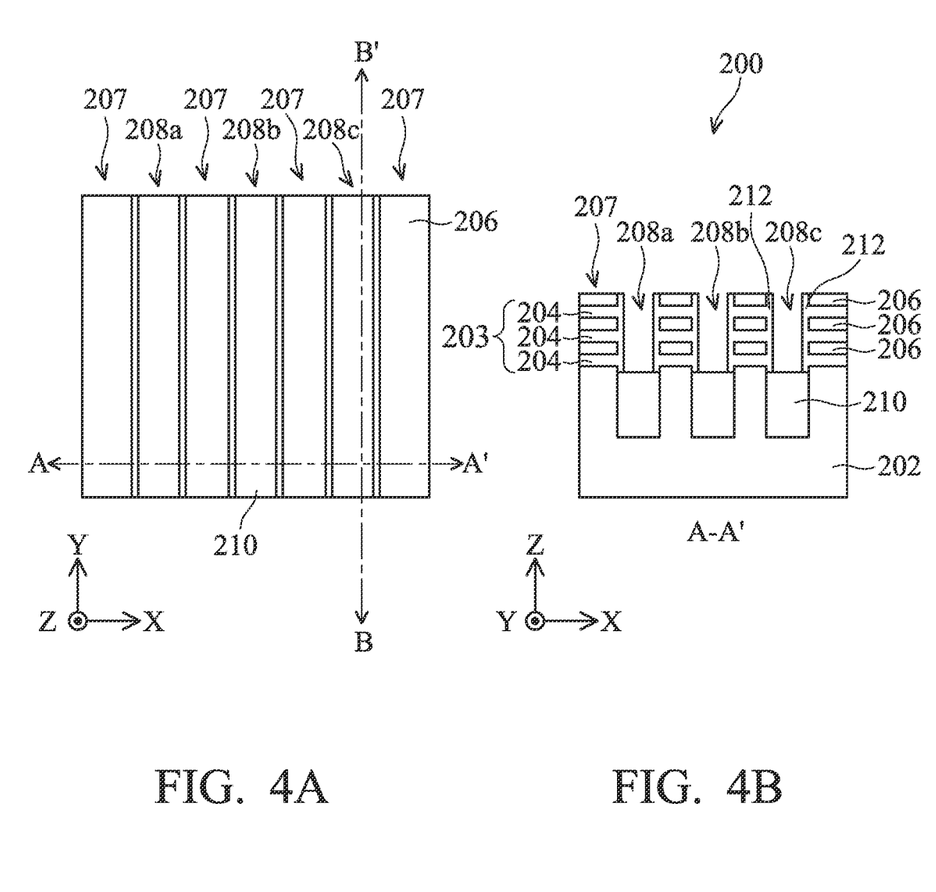
Figure 4C:
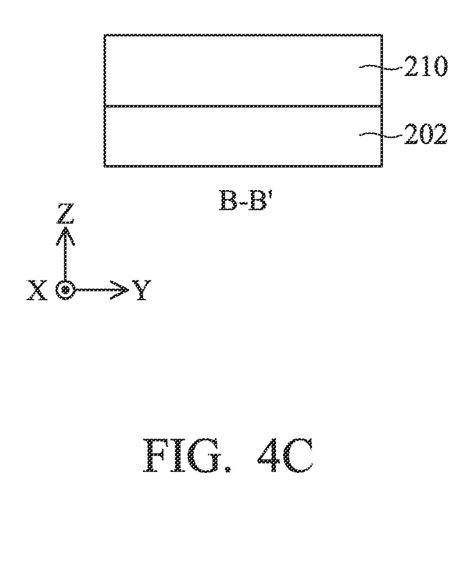

With reference to FIGS. 4A, 4B, and 4C, in an embodiment of block 106, STI regions 210 are deposited in the trenches 208a, 208b, 208c and cladding material 212 is deposited along sidewalls of the semiconductor layers 204, 206 within the trenches 208a, 208b, 208c.

After forming the fins 207, the trenches 208a, 208b, 208c interposing the fins 207 may be filled with a dielectric material to form shallow trench isolation (STI) features interposing the fins 207, where the STI features are subsequently recessed to form the STI features 210. In some embodiments, the dielectric layer used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process.

After depositing the STI features 210, a cladding (semiconductor) layer 212 is formed on the sidewalls of the semiconductor layers 204/206 in the trenches 208a, 208b, 208c. The cladding 212 extends from the top surface of STI 210 in trenches 208a, 208b, 208c to the top surface of the stack of semiconductor materials (e.g. the top most semiconductor layer 206 in the depicted embodiment). In an embodiment, the cladding layer 212 includes SiGe. The cladding layer 212 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After the cladding layer 212 is deposited, an etching process may be performed to remove the portion of the cladding layer 212 from above the STI features 210, for example, using a plasma dry etching process.

The method 100 then proceeds to block 108 where dummy fins are formed in trenches.

Figure 5A:
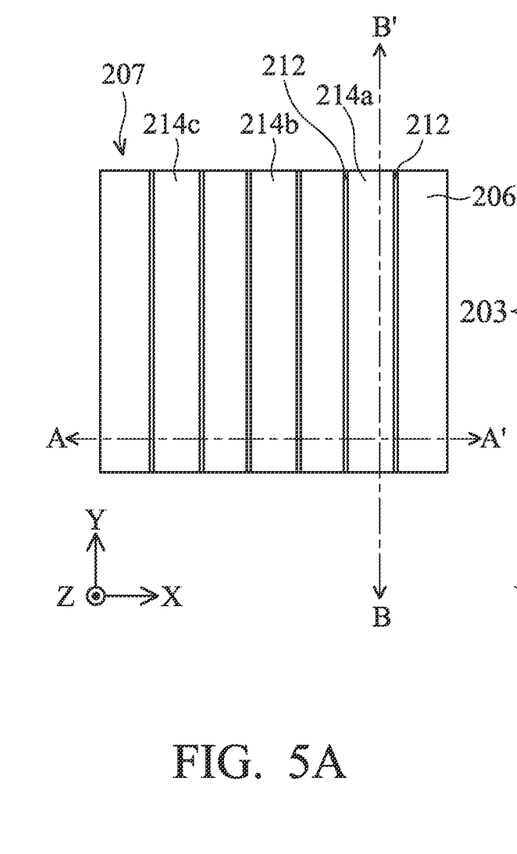
Figure 5B:
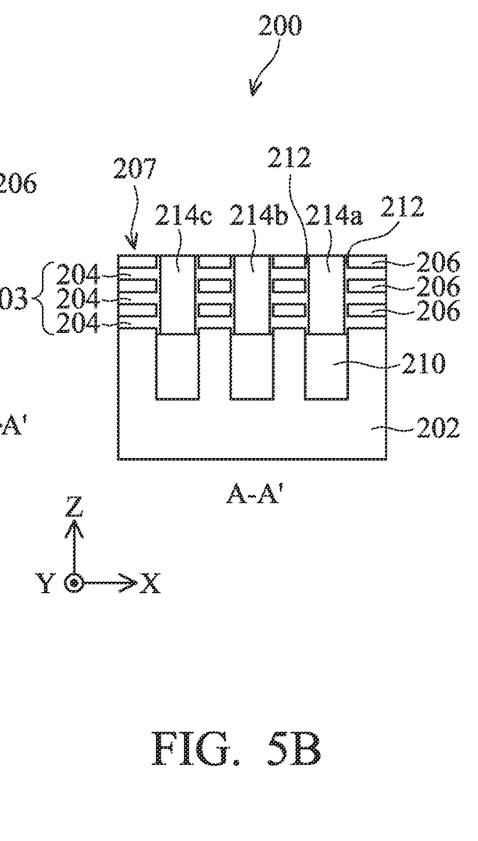
Figure 5C:
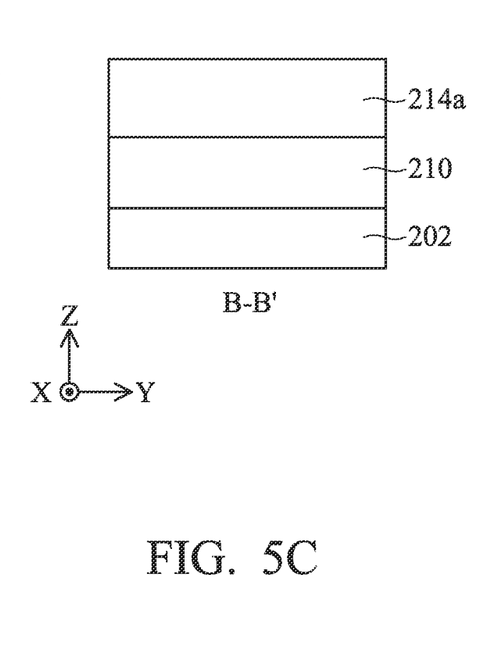

With reference to FIGS. 5A, 5B, and 5C, in an embodiment of block 108, dummy fins 214a, 214b, 214c are formed in the trenches 208a, 208b, and 208c over STI features 210 and cladding layers 212.

In the depicted embodiment, the dummy fins 214a, 214b, 214c include silicon. In some embodiments, the dummy fin 214a, 214b, 214c may include a dielectric material such as a low-K (LK) material including SiCN, SiOC, SiOCN, or another low-K material (e.g., with a dielectric constant 'k'<7). In some embodiments, the dummy fin 214a, 214b, 214c may include a dielectric material such as a high-K (HK) material including HfO2, ZrO2, HfAlOx, HfSiOx, Al2O3, or another high-K material (e.g., with a dielectric constant 'k'>7). In some embodiments, the dummy fin 214a, 214b, 214c may include multiple layers of dielectric materials including an LK material layer and an HK material layer. The dummy fin 214a, 214b, 214c is deposited over the cladding layer 212 and on top surfaces of the STI 210, filling the gaps between the fins 207 (including between the semiconductor material stacks 203). In some embodiments, dummy fins 214a, 214b, 214c may effectively prevent the undesirable lateral merging of the source/drain epi-layers formed on adjacent fins 207, as discussed in more detail below.

The method 100 then proceeds to block 110 where a dummy gate structure is formed over the semiconductor device. While the present discussion is directed to a replacement gate (gate-last) process whereby a dummy gate structure is formed and subsequently replaced, other configurations may be possible.

Figure 6A:
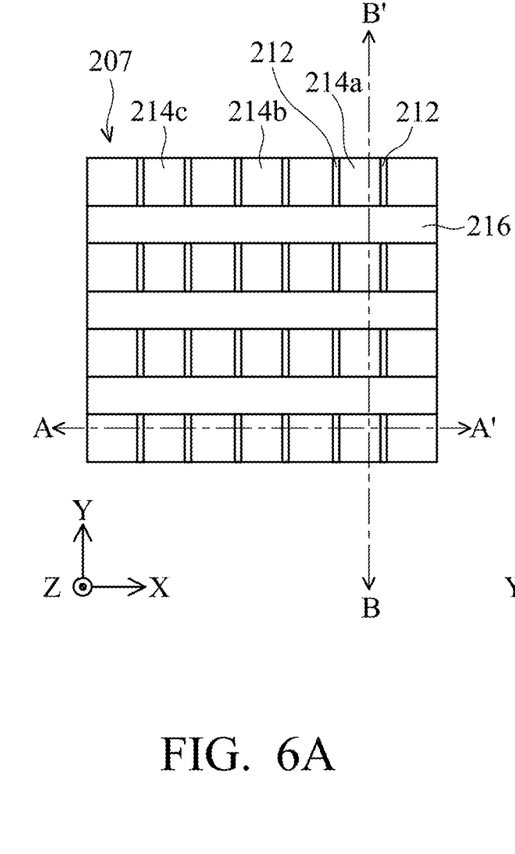
Figure 6B:
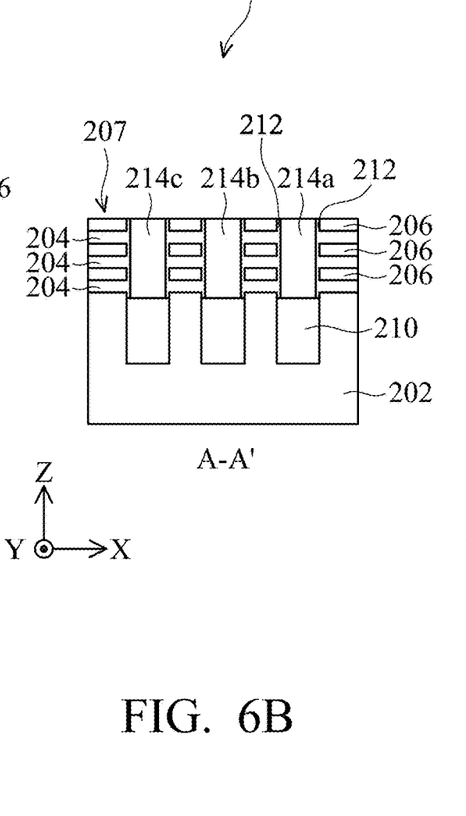
Figure 6C:
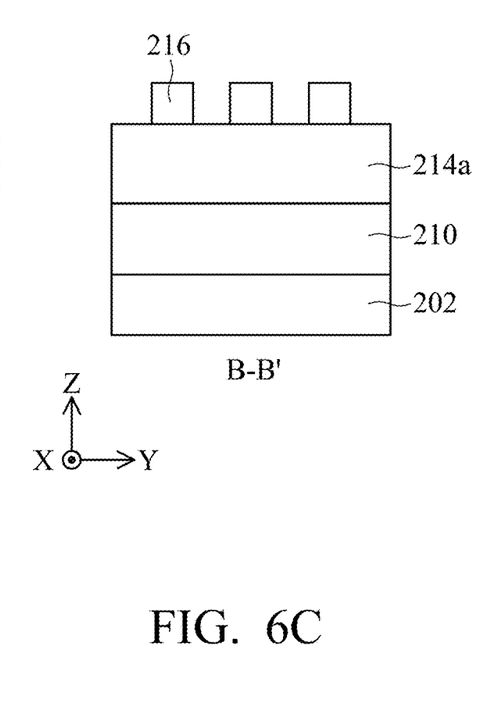

With reference to FIGS. 6A, 6B, and 6C, in an embodiment of block 110, dummy gate stacks 216 are formed over the fins 207 and the dummy fins 214a, 214b, 214c. In an embodiment, the gate stacks 216 are dummy (sacrificial) gate stacks that are subsequently removed and replaced by the final gate stack at a subsequent processing stage of the semiconductor device 200, as discussed below. The gate stacks 216 may be replaced at a later processing stage by a high-K dielectric layer (HK) and metal gate electrode (MG). In some embodiments, the gate stacks 216 are formed over the substrate 202 and are at least partially disposed over the fins 207 and the dummy fins 214a, 214b, 214c. The portion of the fins 207 underlying the gate stacks 216 may be referred to as the channel region. The gate stacks 216 may also define a source/drain region of the fins 207, for example, as the regions of the fins 207 adjacent to and on opposing sides of the channel region.

In some embodiments, the gate stacks 216 may include a dielectric layer and an electrode layer. The gate stacks 216 may also include one or more hard mask layers. In some embodiments, the hard mask layer may include an oxide layer, and the hard mask layer may include a nitride layer. In some embodiments, the gate stacks 216 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 216 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. By way of example, the etching process used to form the gate stacks 216 may also etch portions of a hard mask adjacent to and on either side of the gate stacks 216, stopping on the topmost epitaxial layer 206.

The method 100 then proceeds to block 112 where source/drain features are formed.

Figure 7A:
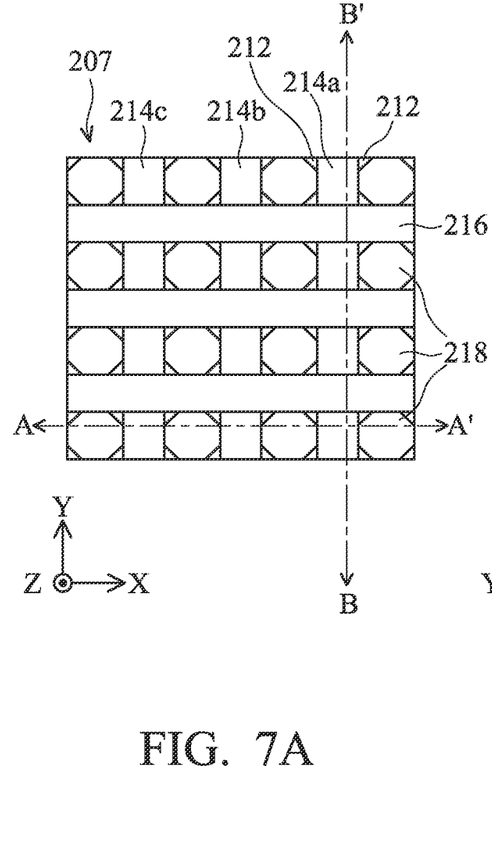
Figure 7B:
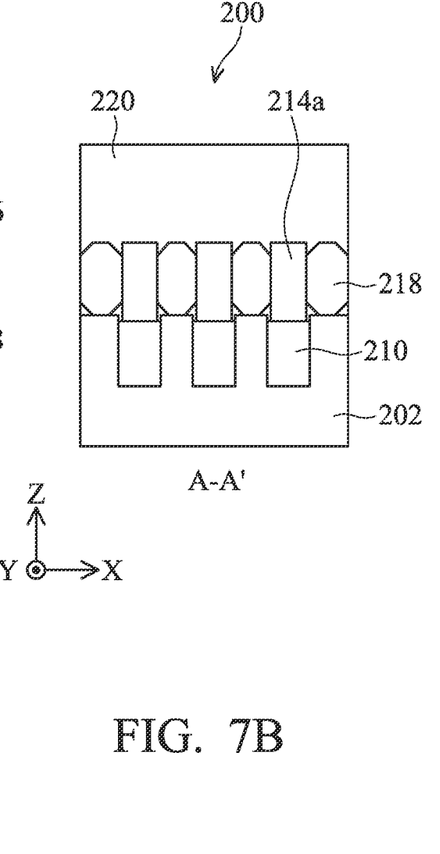
Figure 7C:
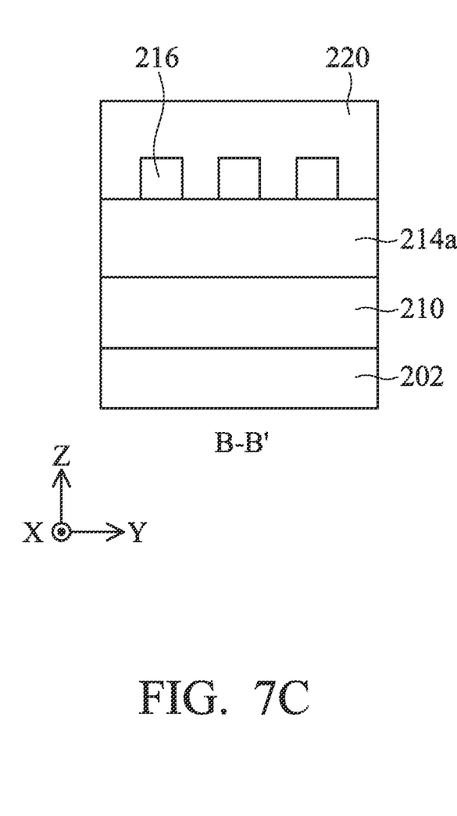

With reference to FIGS. 7A, 7B, and 7C, in an embodiment of block 112, source/drain features 218 are formed adjacent to and on either side of dummy gate stacks 216. In some embodiments, portions of the fins 207 adjacent to and on either side of dummy gate stacks 216 (and including the semiconductor layers 204, 206) may be removed by a suitable etching process and the source/drain features 218 may be formed by epitaxially growing a semiconductor material layer on the exposed substrate 202. In some embodiments, etching the portions of the fins 207 may include a wet etch process, a dry etch process, a multiple-step etch process, and/or a combination thereof. In some embodiments, the source/drain features 218 are formed by epitaxially growing a semiconductor material layer on the exposed substrate 202 portion of the fins 207 in the source/drain regions. In various embodiments, the semiconductor material layer grown to form the source/drain features 218 may include Ge, Si, GaAs, AlGaAs, SiGe, GaAsP, SiP, or other suitable material. The source/drain features 218 may be formed by one or more epitaxial (epi) processes. In some embodiments, the source/drain features 218 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 218 are not in-situ doped, and instead an implantation process is performed to dope the source/drain features 218. In some embodiments, formation of the source/drain features 218 may be performed in separate processing sequences for each of N-type and P-type source/drain features. As illustrated in FIGS. 7A and 7B, the dummy fins 214a, 214b, 214c may effectively prevent the undesirable lateral merging of the source/drain features 218 formed on adjacent fins 207.

In some embodiments, and prior to formation of the source/drain features 218, inner spacer layers may be formed. Formation of the inner spacers may include a lateral etch of the epitaxial layers 206, followed by deposition and etch-back of a dielectric material to form the inner spacers. In some embodiments, the inner spacers include amorphous silicon.

The method 100 then proceeds to block 114 where an inter-layer dielectric (ILD) layer is formed. Continuing with the example of FIGS. 7A, 7B, and 7C, in an embodiment of block 114, an ILD layer 220 is formed over the semiconductor device 200. In the depicted embodiment, the top down view of FIG. 7A, as well as subsequent top down views, does not include the ILD layer 220 for clarity. In some embodiments, a contact etch stop layer (CESL) is formed over the device 200 prior to forming the ILD layer 220. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 220 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 220 may be deposited by a PECVD process or other suitable deposition technique. In some embodiments, after formation of the ILD layer 220, the semiconductor device 200 may be subject to a high thermal budget process to anneal the ILD layer 220.

In some examples, after depositing the ILD layer 220 (and/or the CESL or other dielectric layers), a planarization process may be performed to expose a top surface of the gate stacks 216. For example, a planarization process includes a CMP process which removes portions of the ILD layer 220 (and CESL layer, if present) overlying the gate stacks 216 and planarizes a top surface of the semiconductor device 200. In addition, the CMP process may remove any hard mask layers overlying the gate stacks 216 to expose the underlying electrode layer, such as a polysilicon electrode layer, of the dummy gate.

The method 100 then proceeds to block 116 where a dummy fin cut process is performed.

Figure 8A:
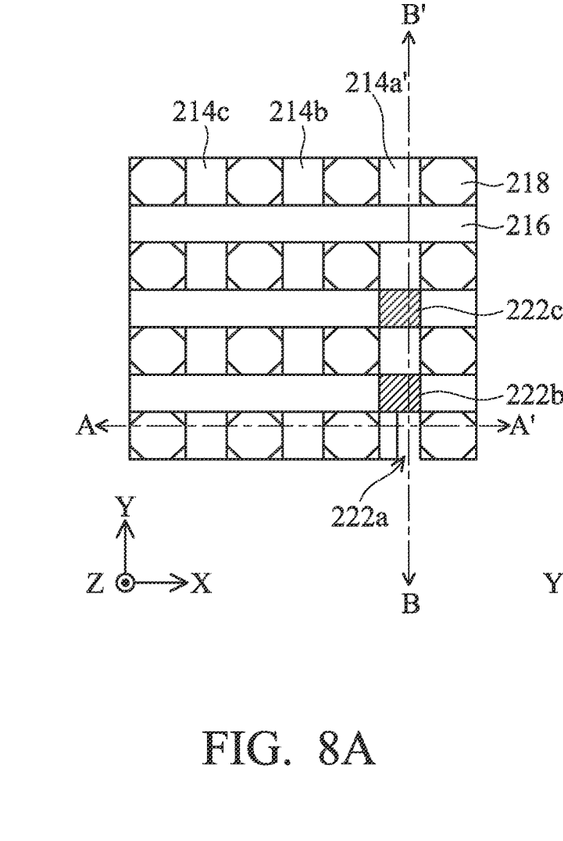
Figure 8B:
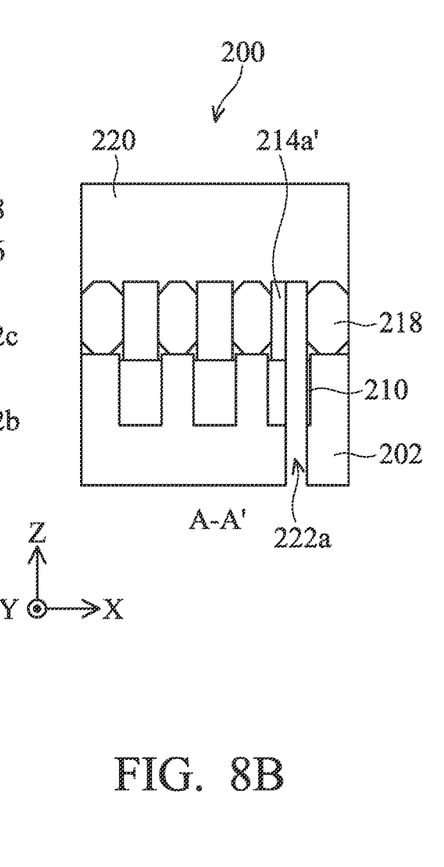
Figure 8C:
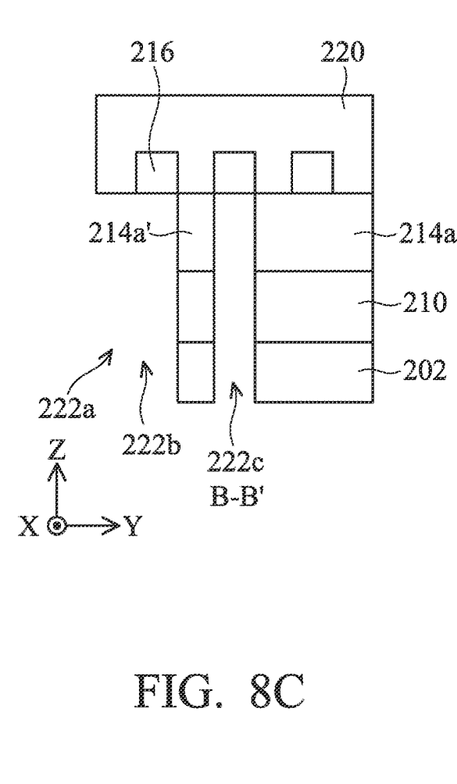

With reference to FIGS. 8A, 8B, and 8C, in an embodiment of block 116, a dummy fin cut process is performed to create dummy fin trenches 222a, 222b, and 222c. In some embodiments, a lithography and etching process is performed from the backside of the semiconductor device 200 to form a trenches 222a, 222b, and 222c (e.g. slot openings). In the depicted embodiment, FIGS. 8A and 8B illustrate trench 222a and FIGS. 8A and 8C illustrate trenches 222a, 228b, and 222c. As depicted in FIG. 8A, trenches 222b and 222c are illustrated as lined portions of dummy gate stack 216 to indicate that the trenches 222b and 222c are formed below the dummy gate stack 216. In the depicted embodiment, trenches 222a, 222b, 222c are formed only in dummy fin 214a. In some embodiments, trenches 222a, 222b, 222c may be formed in one or more or dummy fins 214a, 214b, 214c. The etching processes used to form trenches 222a, 222b, 222c may be a dry etching process, a wet etching process, other suitable etching process, or combinations thereof.

In the depicted embodiment, trench 222a is formed by etching, from the backside of the semiconductor device 200, a first portion of the substrate 202, a first portion of the STI 210, and a first portion of the dummy fin 214a with minimal (to no) etching of the ILD 220. In some embodiments, etching the trench 222a may be performed as a series of individual etching processes where a first etching process selectively removes material of the substrate 202, a second etching process selectively removes material of the STI 210, and a third etching process selectively removes material of the dummy fin 214a. In some embodiments, the trench 222a may be about half the width of the dummy fin 214a as measured in a first direction, the first direction being parallel to the dummy gate stacks 216. In some embodiments, the trench 222a may have a first sidewall defined by remaining portions of the substrate 202, remaining portions of the STI 214a, and remaining portions of the dummy fin 214a, a second opposing sidewall defined by remaining portions of the substrate 202, remaining portions of the STI 210, and remaining portions of the source/drain feature 218, third sidewall defined by trench 222b, an opposing fourth sidewall defined by remaining portions of the substrate 202, remaining portions of the STI 210, and remaining portions of the dummy fin 214a, and a bottom defined by the ILD 220.

In the depicted embodiment, trench 222b is formed by etching, from the backside of the semiconductor device 200, a second portion of the substrate 202, a second portion of the STI 210, and a second portion of the dummy fin 214a with minimal (to no) etching of the dummy gate stack 216. In some embodiments, etching the trench 222b may be performed as a series of individual etching processes where a first etching process selectively removes material of the substrate 202, a second etching process selectively removes material of the STI 210, and a third etching process selectively removes material of the dummy fin 214a. In some embodiments, the trench 222b may be the width of the dummy fin 214a as measured in the first direction and the length of dummy gate stack 216 as measured in a second direction, the second direction being perpendicular to the dummy gate stack 216. In some embodiments, the trench 222b may have a first sidewall and an opposing second sidewall defined by remaining portions of the substrate 202 and fins 207, a third sidewall defined by remaining portions of the substrate 202, remaining portions of the STI 210, and remaining portions of the dummy fin 214a, an opposing fourth sidewall partially defined by remaining portions of the substrate 202, remaining portions of the STI 210, and remaining portions of the dummy fin 214a and partially defined by trench 222a, and a bottom defined by the dummy gate stack 216.

In the depicted embodiment, trench 222c is formed by etching, from the backside of the semiconductor device 200, a third portion of the substrate 202, a third portion of the STI 210, and a third portion of the dummy fin 214a with minimal (to no) etching of the dummy gate stack 216. In some embodiments, etching the trench 222c may be performed as a series of individual etching processes where a first etching process selectively removes material of the substrate 202, a second etching process selectively removes material of the STI 210, and a third etching process selectively removes material of the dummy fin 214a. In some embodiments, the trench 222c may be the width of the dummy fin 214a as measured in the first direction and the length of dummy gate stack 216 as measured in a second direction. In some embodiments, the trench 222c may have a first sidewall and an opposing second sidewall defined by remaining portions of the substrate 202 and fins 207, a third sidewall and an opposing fourth sidewall defined by remaining portions of the substrate 202, remaining portions of the STI 210, and remaining portions of the dummy fin 214a, and a bottom defined by the dummy gate stack 216.

In the depicted embodiment, a dummy fin 214a' remains after removing the first portion, second portion, and third portion of the dummy fin 214 to form trenches 222a, 222b, 222c.

The method 100 then proceeds to block 118 where dielectric is deposited in dummy fin trench.

Figure 9A:
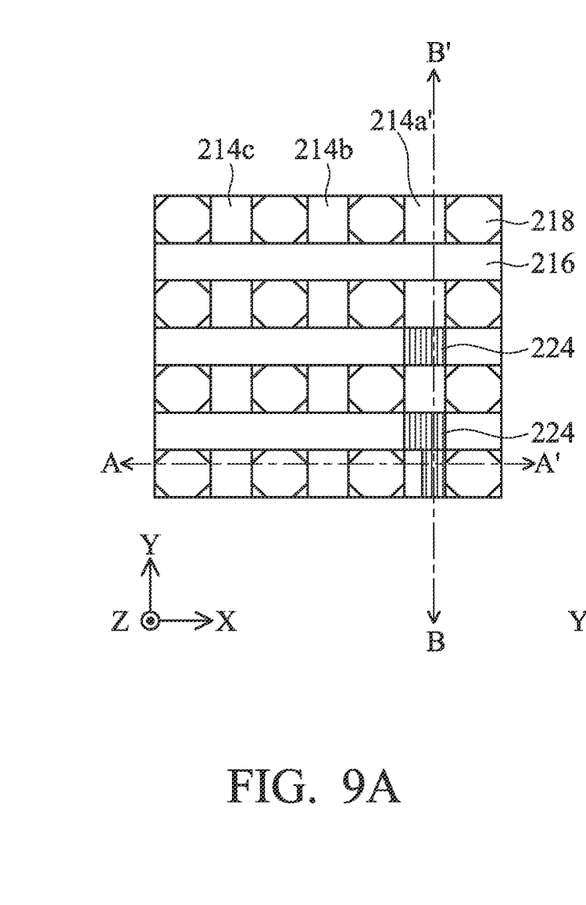
Figure 9B:
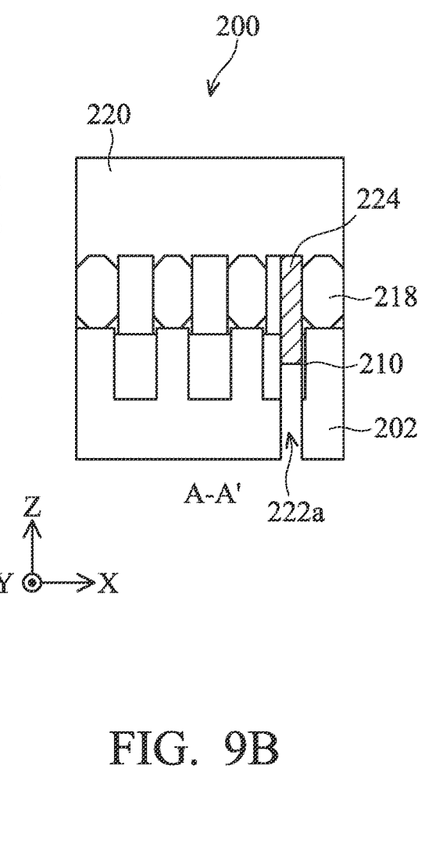
Figure 9C:
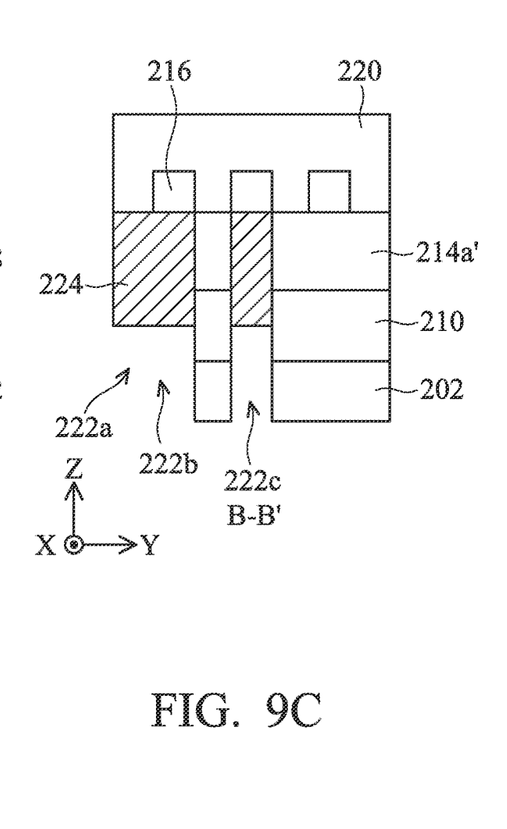

With reference to FIGS. 9A, 9B, and 9C, in an embodiment of block 118, a dielectric 224 is deposited in the dummy fin trenches 222a, 222b, and 222c followed by an etch-back process to recess the dielectric 224. In some embodiments, the dielectric 224 may include a dielectric material such as a low-K (LK) material including SiCN, SiOC, SiOCN, or another low-K material (e.g., with a dielectric constant 'k'<7). In some embodiments, the dielectric 224 may include a dielectric material such as a high-K (HK) material including HfO2, ZrO2, HfAlOx, HfSiOx, Al2O3, or another high-K material (e.g., with a dielectric constant 'k'>7). In some embodiments, the dielectric 224 may include multiple layers of dielectric materials including an LK material layer and an HK material layer.

The method 100 then proceeds to block 120 where the dummy fin is replaced with a metal layer.

Figure 10A:
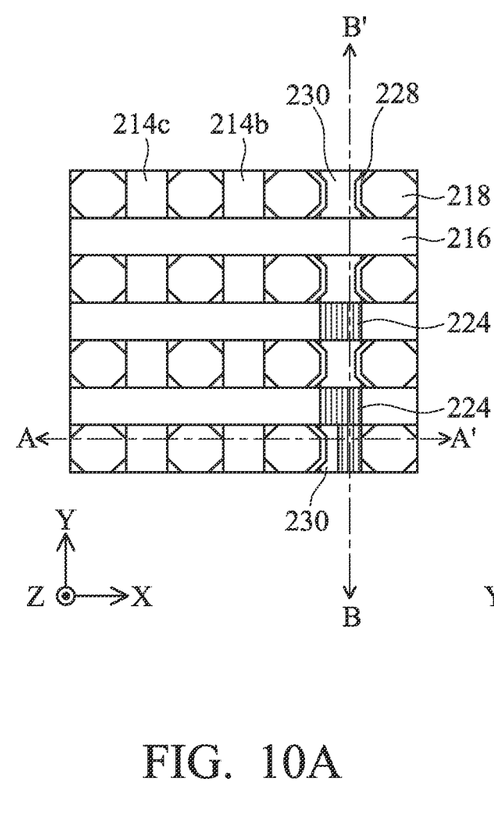
Figure 10B:
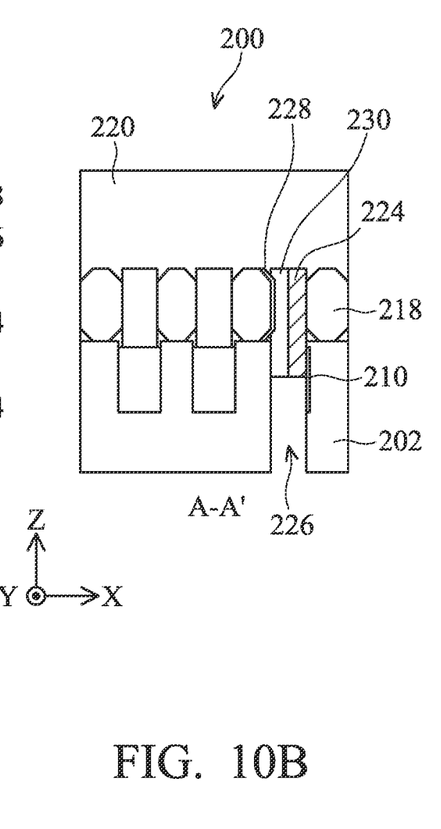
Figure 10C:
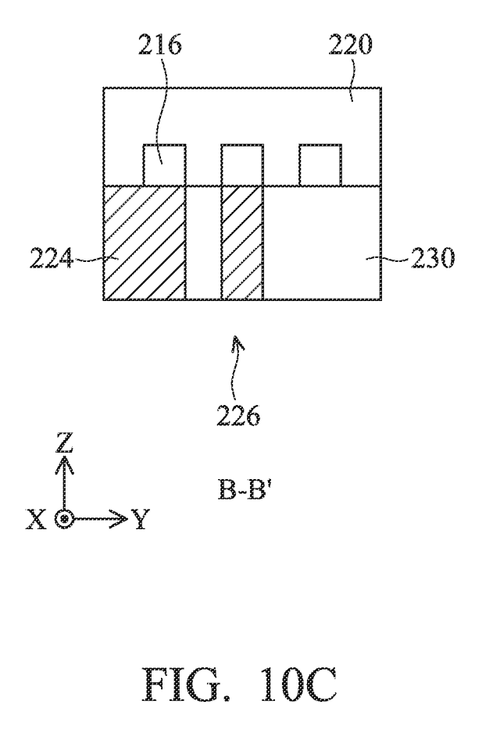

With reference to FIGS. 10A, 10B, and 10C, in an embodiment of block 120, the dummy fin 214a' (which remains after removing the first portion, second portion, and third portion of the dummy fin 214 to form trenches 222a, 222b, 222c) is replaced with a source/drain contact 230. In some embodiments, the dummy fin 214a' may be removed through a suitable patterning and etch process to form a trench 226. In some embodiments, the etching process is tuned (selective) to remove the dummy fin 214a' with minimal (to no) etching of the dielectric 224 or the dummy gate stacks 216. The etching process can include a dry etching process, a wet etching process, other suitable etching process, or combinations thereof.

In some embodiments, a silicide 228 is formed in the trench 226 and over a sidewall of the epitaxial source/drain features 218 exposed by the trench 226. Silicide 228 may be formed by depositing a metal layer over source/drain features 218 and heating the semiconductor device 200 (for example, subjecting the semiconductor device 200 to an annealing process) to cause constituents of source/drain features 218 (for example, silicon and/or germanium) to react with metal constituents of the metal layer. The metal layer includes any metal constituent suitable for promoting silicide formation, such as nickel, platinum, palladium, vanadium, titanium, cobalt, tantalum, ytterbium, zirconium, other suitable metal, or combinations thereof. Silicide 228 thus includes a metal constituent and a constituent of the source/drain feature 218, such as silicon and/or germanium. In some embodiments, silicide 228 includes nickel silicide, titanium silicide, or cobalt silicide. Any un-reacted metal, such as remaining portions of the metal layer, may be selectively removed relative to silicide 228 and/or a dielectric material, for example, by an etching process.

A source/drain contact 230 metal layer may then be formed in the trench 226 on and over the silicide 228 that may be formed over the sidewall of the source/drain features 218. In some embodiments, the source/drain contact 230 may be formed over sidewalls of the dielectric 224, under the dummy gate stack 216, and over exposed sidewalls of the fins 207. In some embodiments, an etch-back process may be performed to recess the source/drain contact 230. In some embodiments, the source/drain contact 230 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the source/drain contact 230 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the source/drain contact 230 may be formed by ALD, PVD, CVD, e-beam evaporation, or other suitable process.

The method 100 then proceeds to block 122 where a power rail is formed.

Figure 11A:
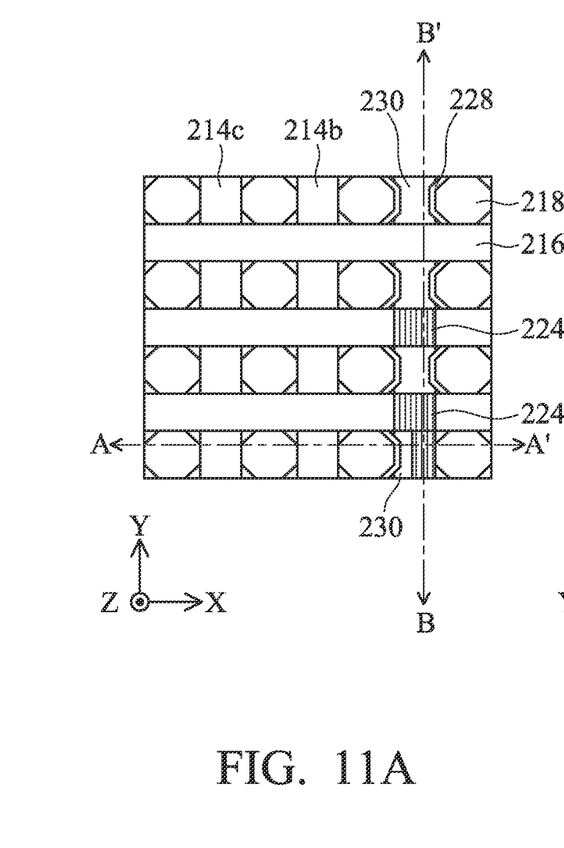
Figure 11B:
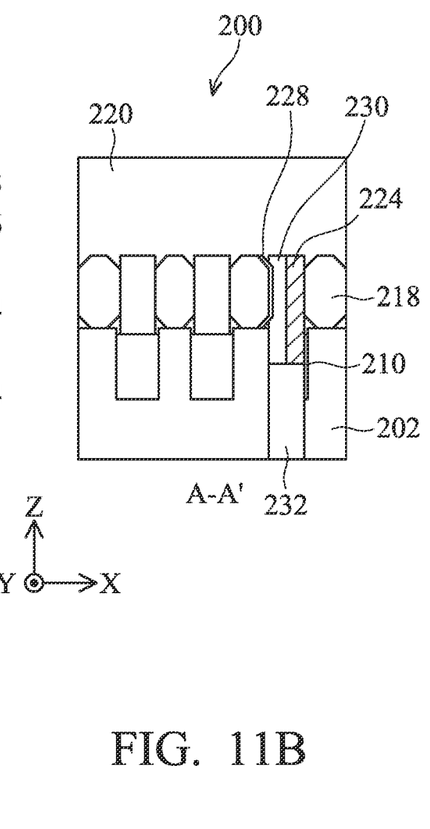
Figure 11C:
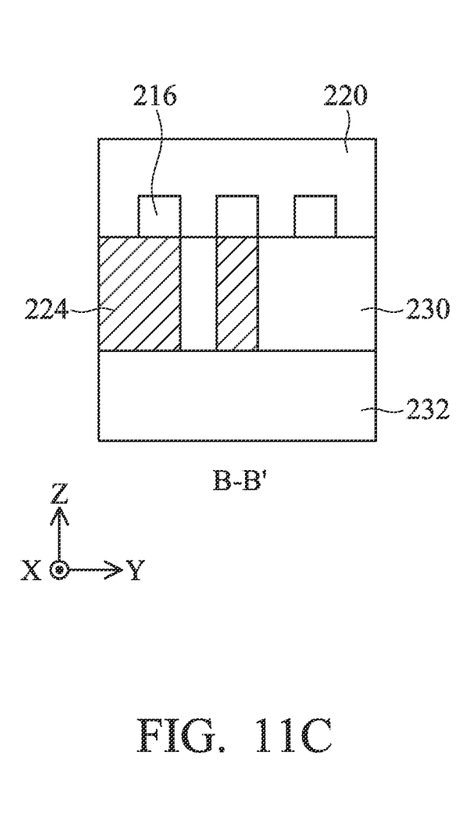

With reference to FIGS. 11A, 11B, and 11C, continuing with the embodiment of block 122, a backside power rail 232 formed to contact the source/drain contact 230.

In some embodiments, the backside power rail 232 may be embedded in an insulation layer. The insulation layer may have a composition similar to the first ILD layer 220 and may be deposited over the back side of the semiconductor device 200 using spin-on coating, FCVD, or CVD. In some embodiments, a barrier layer and a metal fill material may then be deposited into the trench 226 to form the backside power rail 232. In some embodiments, the barrier layer in the backside power rail may include titanium nitride, tantalum nitride, cobalt nitride, nickel nitride, or tungsten nitride and the metal fill material in the backside power rail may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer. In some embodiments, the backside power rail 232 may be in direct contact with and electrically coupled to the source/drain contact 230, which in turn may contact the source/drain feature 218 (e.g., through the silicide 228).

With respect to the description provided herein, disclosed are methods and structures including a self-aligned source/drain contact formation scheme. In various embodiments, the disclosed self-aligned source/drain contact formation scheme may provide contact to a power rail disposed along a backside of a substrate to achieve lower resistance at the contact areas. In some embodiments, the disclosed self-aligned source/drain contact formation scheme allows for a larger contact area while improving device density and performance. In some embodiments, the self-aligned backside contact allows for a larger contact area, thereby reducing the resistance of the contact area. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method of fabricating a semiconductor device that includes forming a source/drain feature adjacent to a semiconductor layer stack disposed over a substrate. The method further includes forming a dummy fin adjacent to the source/drain feature and adjacent to the semiconductor layer stack. The method further includes performing an etching process from a backside of the substrate to remove a first portion of the dummy fin adjacent to the source/drain feature, thereby forming a first trench in the dummy fin, were the first trench extends from the dummy fin to the source/drain feature.

In another of the embodiments, discussed is a method of fabricating a semiconductor device that includes forming a first semiconductor fin over a substrate. The method further includes forming a second semiconductor fin over the substrate, the second semiconductor fin being adjacent the first semiconductor fin. The method further includes depositing a dummy fin adjacent to the first semiconductor fin and adjacent to the second semiconductor fin. The method further includes, etching a first portion of the dummy fin from a backside of the substrate thereby forming a first trench, where the first trench extends from the first semiconductor fin to the second semiconductor fin. The method further includes, depositing a dielectric layer in the first trench and etching a second portion of the dummy fin from the backside of the substrate thereby forming a second trench. Finally, the method further includes, depositing a metal layer in the second trench.

In yet another of the embodiments, discussed is a semiconductor device that including a source/drain feature disposed over a substrate. The semiconductor device further includes a dielectric layer disposed over the substrate and adjacent to the source/drain feature. The semiconductor device further includes a metal contact disposed over the substrate and interposing the source/drain feature and the dielectric layer and a power rail disposed within the substrate and below the metal contact, wherein the power rail physically contacts the metal contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a source/drain feature adjacent to a semiconductor layer stack disposed over a substrate, the source/drain feature and the semiconductor layer stack disposed along a first plane that extends in a first direction in a top down view;
   forming a dummy fin disposed along a second plane in the top view, the second plane parallel to the first plane and extending in the first direction, wherein the dummy fin is adjacent to each of the source/drain feature and the semiconductor layer stack in a second direction in the top down view, the second direction perpendicular to the first direction;
   performing an etching process from a backside of the substrate to remove a first portion of the dummy fin adjacent to the source/drain feature, thereby forming a first trench in the dummy fin, wherein the first trench extends from the dummy fin to the source/drain feature;
   forming a first dielectric layer in the first trench; and
   replacing a second portion of the dummy fin with a source/drain contact.

2. The method of claim 1, further comprising:
   forming a dummy gate stack over the dummy fin and the semiconductor layer stack and adjacent to the source/drain feature; and
   forming an interlayer dielectric over the dummy fin, the dummy gate stack, and the source/drain feature.

3. The method of claim 1, wherein the dummy fin includes silicon.

4. The method of claim 1, further comprising:
   before forming the dummy fin, forming a shallow trench isolation layer along a bottom and sidewalls of the first trench; and
   forming a cladding layer over the shallow trench isolation layer and on sidewalls of the first trench.

5. The method of claim 1, further comprising:
   before the replacing the second portion of the dummy fin with the source/drain contact, removing a third portion of the dummy fin thereby forming a second trench, wherein the third portion of the dummy fin is below a dummy gate stack; and
   forming a second dielectric layer in the second trench.

6. The method of claim 5, wherein the replacing the second portion of the dummy fin with the source/drain contact further comprises:
   etching the second portion of the dummy fin from the backside of the substrate, exposing a sidewall surface of the source/drain feature;
   forming a silicide layer over the exposed sidewall surface of the source/drain feature; and
   depositing the source/drain contact over the silicide layer.

7. The method of claim 1, further comprising:
   forming a power rail over a portion of the source/drain contact exposed on the backside of the substrate.

8. A method, comprising:
   forming a first semiconductor fin over a substrate, the first semiconductor fin extending in a first direction in a top view;
   forming a second semiconductor fin over the substrate, the second semiconductor fin parallel to the first semiconductor fin and extending in the first direction in the top view;
   depositing a dummy fin adjacent to the first semiconductor fin and adjacent to the second semiconductor fin, wherein each of the first and second semiconductor fins are disposed laterally from the dummy fin along a second direction perpendicular to the first direction;

etching a first portion of the dummy fin from a backside of the substrate thereby forming a first trench, wherein the first trench extends from the first semiconductor fin to the second semiconductor fin;

depositing a dielectric layer in the first trench;

etching a second portion of the dummy fin from the backside of the substrate thereby forming a second trench; and depositing a metal layer in the second trench.

9. The method of claim 8, further comprising:
forming a power rail over a portion of the metal layer exposed on the backside of the substrate.

10. The method of claim 8, further comprising:
before depositing the dummy fin, depositing a shallow trench isolation feature over the substrate, the shallow trench isolation feature extending from the first semiconductor fin to the second semiconductor fin;

depositing a cladding layer over the shallow trench isolation feature and along a first sidewall of the first semiconductor fin and along a second sidewall of the second semiconductor fin, the second sidewall opposing the first sidewall; and wherein the dummy fin extends from the first sidewall to the second sidewall.

11. The method of claim 8, further comprising:
forming a dummy gate stack over the first semiconductor fin, the second semiconductor fin, and the dummy fin; and forming an interlayer dielectric over the dummy gate stack, the first semiconductor fin, the second semiconductor fin, and the dummy fin.

12. The method of claim 8, further comprising:
forming a source/drain feature in the first semiconductor fin, wherein the source/drain feature contacts the metal layer.

13. The method of claim 8, wherein the dummy fin includes silicon.

14. The method of claim 8, further comprising:
wherein the etching the second portion of the dummy fin exposes a sidewall surface of a source/drain feature;

forming a silicide layer over the exposed sidewall surface of the source/drain feature; and wherein the metal layer is further formed over the silicide layer.

15. A method, comprising:
epitaxially growing a source/drain feature in contact with a plurality of semiconductor channel layers along a first side of the source/drain feature, the first side of the source/drain feature facing a first direction in a top down view;

forming a dummy fin adjacent to and interfacing the source/drain feature along a second side of the source/drain feature, the second side of the source/drain feature facing a second direction perpendicular to the first direction in the top down view;

replacing a first portion of the dummy fin with a first dielectric layer; and replacing a second portion of the dummy fin with a source/drain contact, the source/drain contact interposing the first dielectric layer and the source/drain feature, and the source/drain contact electrically connected to the source/drain feature.

16. The method of claim 15, wherein the replacing the first portion of the dummy fin comprises:
performing an etching process from a backside of a substrate to remove the first portion of the dummy fin and form a first trench; and forming the first dielectric layer in the first trench.

17. The method of claim 15, further comprising:
forming a dummy gate stack over the dummy fin and adjacent to the source/drain feature; and forming an interlayer dielectric over the dummy fin, the dummy gate stack, and the source/drain feature.

18. The method of claim 15, wherein the dummy fin includes a second dielectric layer different than the first dielectric layer.

19. The method of claim 15, further comprising:
forming a backside power rail electrically connected to the source/drain contact.

20. The method of claim 15, wherein the replacing the second portion of the dummy fin with the source/drain contact further comprises:
etching the second portion of the dummy fin from a backside of a substrate to form a second trench that exposes a sidewall surface of the source/drain feature;

forming a silicide layer within the second trench and over the exposed sidewall surface of the source/drain feature; and forming the source/drain contact over the silicide layer.

* * * * *